United States Patent [19]
Babie et al.

[11] Patent Number: 5,431,772
[45] Date of Patent: *Jul. 11, 1995

[54] SELECTIVE SILICON NITRIDE PLASMA ETCHING PROCESS

[75] Inventors: Wayne T. Babie, Poughkeepsie; Kenneth L. Devries, Hopewell Junction; Bang C. Nguyen, Wappingers Falls; Chau-Hwa J. Yang, Hopewell Junction, all of N.Y.

[73] Assignee: International Business Machines Corporation, Armonk, N.Y.

[*] Notice: The portion of the term of this patent subsequent to Feb. 23, 2010 has been disclaimed.

[21] Appl. No.: 963,890

[22] Filed: Oct. 19, 1992

Related U.S. Application Data

[63] Continuation of Ser. No. 700,871, May 9, 1991, Pat. No. 5,188,704.

[51] Int. Cl.⁶ .................. B44C 1/22; C03C 15/00; C03C 25/06
[52] U.S. Cl. .................. 156/643.1; 437/238; 437/241
[58] Field of Search ............ 156/643, 653, 657, 662, 156/646; 437/238, 241

[56] References Cited

U.S. PATENT DOCUMENTS

| | | | |
|---|---|---|---|
| 4,374,698 | 2/1983 | Sanders et al. | 156/657 |
| 4,377,438 | 3/1983 | Moriya et al. | 156/653 |
| 4,529,476 | 7/1985 | Kawamoto et al. | 156/653 |
| 4,639,288 | 1/1987 | Price et al. | 156/653 |
| 4,678,539 | 4/1987 | Tomita et al. | 156/653 |
| 4,740,268 | 4/1988 | Bukhman | 156/646 |
| 4,764,244 | 8/1988 | Chitty et al. | 156/646 |
| 4,786,352 | 11/1988 | Benzing | 156/643 |
| 5,188,704 | 2/1993 | Babie et al. | 156/643 |

Primary Examiner—R. Bruce Breneman
Assistant Examiner—B. Everhart
Attorney, Agent, or Firm—Michael J. Balconi-Lamica; Graham S. Jones, II

[57] ABSTRACT

A two step method of etching a silicon nitride layer carrying a surface oxygen film from a substrate in a plasma reactor employs the steps of (1) a breakthrough step of employing a plasma of oxygen free etchant gases to break through and to remove the surface oxygen containing film from the surface of the silicon nitride layer, and (2) a main step of etching the newly exposed silicon nitride with etchant gases having high selectivity with respect to the silicon oxide underlying the silicon nitride. The plasma etching can be performed while employing magnetic- enhancement of the etching. The plasma etching is performed in a plasma reactor comprising a low pressure, single wafer tool. Plasma etching is performed while employing magnetic-enhancement of the etching. The etchant gases include a halide such as a bromide and a fluoride in the breakthrough step. The etchant gases include an oxygen and bromine containing gas in the main step.

7 Claims, 4 Drawing Sheets

SELECTIVE SILICON NITRIDE PLASMA ETCHING PROCESS

This is a continuation application of application Ser. No. 07/700,871 filed May 9, 1991, now U.S. Pat. No. 5,188,704.

BACKGROUND OF THE INVENTION

1. Field of the Invention

This invention relates to plasma etching of silicon nitride.

2. Discussion of Related Art

One selective nitride etching process for producing an sidewall process utilizes a Cl₂/O₂/Ar plasma etching chemistry at a selectivity of nitride over oxide of about 4–5:1. Overetching of such a silicon nitride layer can lead to total loss of an underlying thin SiO₂ stopping layer and there is the potential of damage to the underlying Si substrate at the surface juxtaposed with the emitter opening in the surface of the Si substrate of a transistor being formed in the Si substrate.

U.S. Pat. No. 4,374,698 of Sanders et al, for "Method of Manufacturing a Semiconductor Device" etches silicon nitride and silicon oxide in a plasma with the silicon nitride layers being etched five times faster than the silicon oxide layers. The use of a gaseous compound containing a halogen other than a fluoride is described.

The gas composition preferably includes

| | |
| --- | --- |
| 62.5% | SiF₄ |
| A halogen compound other than a fluoride: | |
| 7.5% (2–8% pref) | CF₃Br or |
| 1–15% | CF₂Cl2 |
| An oxidation compound or molecule: | |
| 30% | NO (range 20–40%) or |
| 3–10% | O₂ |
| 0% | diluent gas listed |
| Preferred reactor conditions | |
| pressure | 100 Pascal |
| temperature | 125 deg. C. substrate temp. |
| RF power | 150 Watts |

U.S. Pat. No. 4,793,897 of Dunfield et al for "Selective Film Etch Process" uses " . . . a reactant gas mixture of fluorinated etching gas and oxygen for selectively etching a thin film of material such as silicon nitride with high selectivity for a silicon oxide underlayer . . . " without any magnetic field and without any other halides than SiF₄.

The gas composition preferably includes

| | |
| --- | --- |
| 10–400 sccm | Total gas flow |
| 0–100 sccm | NF₃ |
| 0–100 sccm | SiF₄ |
| 0–100 sccm | O₂ |
| 0–100 sccm | He |
| 10–150 sccm | Chamber |
| Preferred reactor conditions | |
| pressure | 0.5–30 mTorr |
| temperature | 25 degrees C. |
| RF power | 100–1500 watts |
| RF Frequency | none listed |

U.S. Pat. No. 4,844,773 of Loewenstein et al for "Process for Etchings Silicon Nitride Film" with respect to FIG. 32 and the process unit 1300 describes a process adapted for a low pressure silicon nitride etch. It is stated that "HBr or CF₃Br provides a very potent passivating chemistry for fluorine-based etches." The Loewenstein patent suggests use of SiF₄ with HBr to etch a thin film of tungsten. However, with respect to silicon nitride, the examples of etches are as follows:

EXAMPLE 1

Gas composition preferably includes

| | |
| --- | --- |
| 1000 sccm | Helium |
| 200 sccm | CF₄ (F₂, CHF₃, C2F₆, SF₆, F₃, or combinations with CF₄) |
| Preferred reactor conditions | |
| pressure | 0.7 Torr |
| temperature | 25 degrees C. |
| RF power | 225 watts |
| RF Frequency | 13.56 MHz |
| Remote RF power | 400 watts |
| Remote RF Frequency | 2450.00 MHz |

EXAMPLE 2

Gas composition preferably includes

| | |
| --- | --- |
| 500 sccm | Helium |
| 100 sccm | SF₆ (or F₂, CF₄, or C2F₆) |
| Preferred reactor conditions | |
| pressure | 50 mTorr, |
| temperature | 25 degrees C. |
| RF power | 200–300 watts |
| RF Frequency | 13.56 MHz |
| Remote RF power | 400 watts |
| Remote RF Frequency | 2450.00 MHz |

The Loewenstein et al patent mentions a magnetron shown in FIG. 15 of that patent in connection with a remote plasma chamber as "an example of a structure which generates activated species by gas flows through a plasma discharge which is remote from the wafer face . . . " There is no mention of the application of a magnetic field to a wafer directly. Instead, a remote gas plasma mixture is applied to the work. There is no discussion of a magnetically confined plasma, but only the remote magnetron is discussed.

It, is an object of this invention to provide a new etching process, capable of etching silicon nitride over SiO₂ very selectively for products where the semiconductor device structure would have an even thinner SiO₂ stopping layer during silicon nitride etching where it is required to assure product manufacturability and acceptable yield capacity in manufacturing.

In accordance with-this invention silicon nitride is etched with a selectivity with respect to SiO₂ better than 6:1 up to over 100:1 depending upon the gas composition and the process conditions employed.

DESCRIPTION OF THE PREFERRED EMBODIMENT

1. Process Overview

This invention utilizes a two-step process in a low pressure, single wafer, plasma reactor employing magnetic enhancement to perform the steps as follows:

(1) break through and to remove surface oxide or oxynitride from the surface of a top silicon nitride layer, and (2) to etch the newly exposed silicon nitride with high selectivity with respect to the silicon oxide underlying the silicon nitride.

The first step employs fluorine radicals to etch away the surface oxygen impurities from the silicon nitride layer in an oxygen-free plasma. Then, the second step uses bromine-containing and oxygen-containing gases to etch primarily the exposed surfaces of the silicon nitride layer in a plasma etching atmosphere which is also magnetically enhanced.

The preferred reactive gas for the step of breaking through the oxynitride layer is $SF_6$ gas with or without a small amount of HBr gas as an additive. The silicon nitride surface oxide or oxynitride impurities, normally less than 50 Angstroms in thickness can be removed from the work piece in a gaseous plasma within a few seconds. The preferred main etchant for silicon nitride etching is a mixture of HBr and $O_2$, with or without diluent such as He. HBr dissociates readily in the presence of oxygen in the plasma and its dissociation can be enhanced by the application of a rotational magnetic field. (See reaction equation (1) below.) The bromine radical is the main etchant for silicon nitride. (See reaction equation (2) below.) At the point of depletion of silicon nitride, an equilibrium exists at the nitride-oxide interface where the rate of oxide etching (forward reaction) is competing with the re-oxidation of silicon bromide or redeposition of oxide (reversed reaction, (see reaction equation (3) below). This equilibrium results in a substantially lower rate of etching of the underlying oxide which favors a high selectivity of silicon nitride-to-silicon oxide in the overall reaction.

(1)

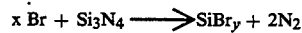

(2)

$$x\,Br + SiO_2 \longrightarrow SiBr_y + 2\,O \quad (3)$$
$$\longleftarrow [y=1\text{-}4]$$

Silicon-containing gases such a silicon tetrafluoride can be used as an additive agent to increase the deposition of silicon oxide at the substrate surface, thus further depressing the etching of silicon oxide in reaction (3) and resulting in an even higher degree of selectivity. However, the addition of silicon tetrafluoride also reduces the etching rate of silicon nitride, which can have a negative impact upon wafer processing throughput in semiconductor device manufacturing.

Plasma Processing System

Figure 1A:
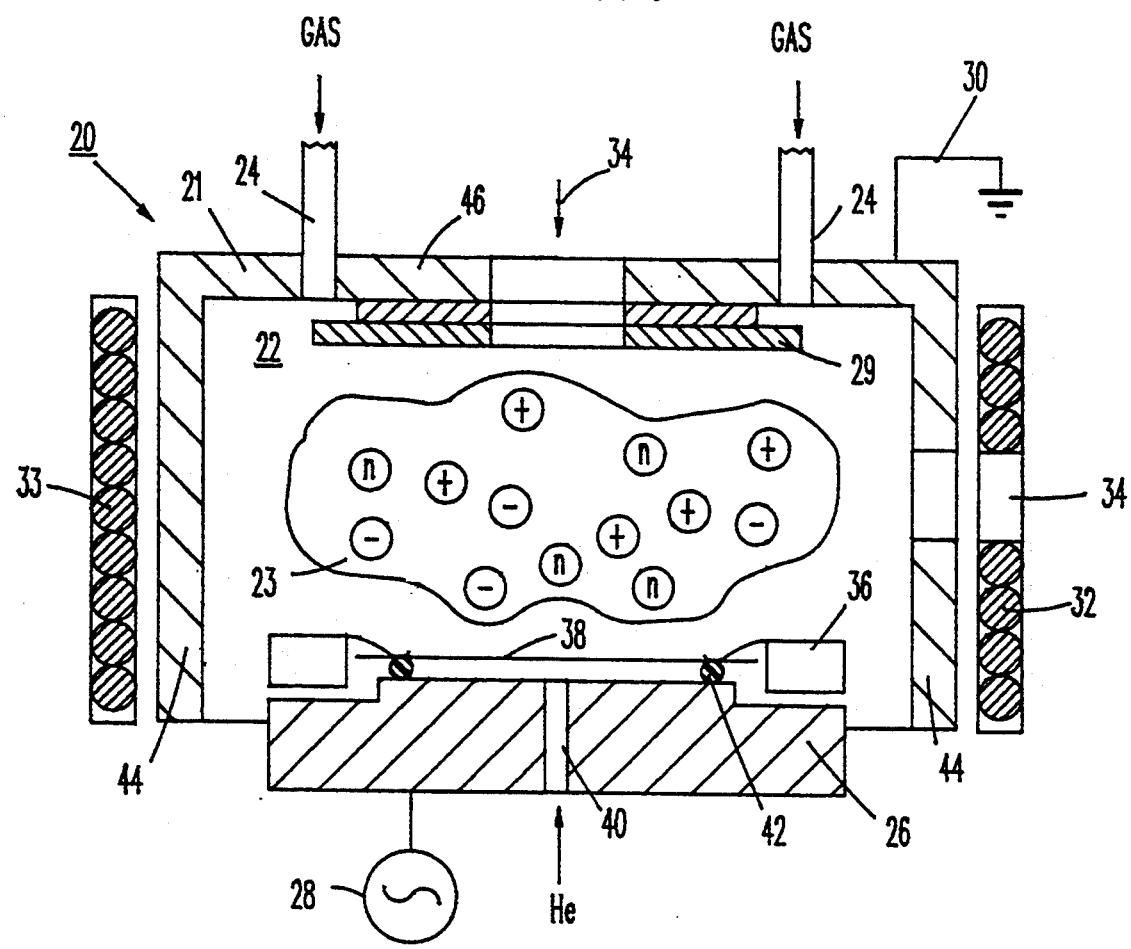
FIGS. 1A and 1B show a chamber housing a plasma etching reactor with an electromagnetic unit for enhancing the plasma.
Figure 1B:
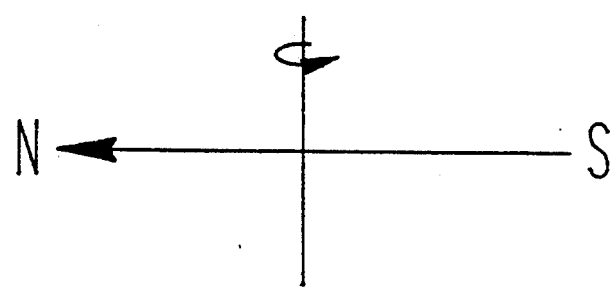

FIGS. 1A and 1B show a plasma processing apparatus suitable for use for performing the processes of this invention. A plasma reactor 20 includes walls 21 housing a reactor chamber 22 wherein a plasma of neutral (n) particles, positive (+) paticles, and negative (−) particles are found. Walls 21 include cylindrical wall 44 and cover 46. Plasma processing gases are introduced via inlets 24 into reactor chamber 22. Plasma etching gases are introduced into chamber 22 through inlets 24. A water cooled cathode 26 is connected to an RF power supply, 28 at 13.56 MHz. An anode 29 is connected to the walls 21 which are grounded by line 30. Helium gas is supplied through passageway 40 through cathode 26 to the space beneath wafer 38 which is supported peripherally by lip seal ring 42 so that the helium gas cools the wafer 38. Wafer support 36 includes a plurality of clamps not shown which hold down the upper surface of wafer 38 at its periphery as is well known to those skilled in the art. A pair of helmholtz configured electromagnetic coils 32 and 33 providing north and south poles within the chamber 22 are disposed at opposite ends of the lateral cylindrical wall 44 of the walls 21. The coils 32 and 33 provide a transverse magnetic field with the north and south poles at the left and right providing a horizontal magnetic field axis parallel to the surface of the wafer 38. The transverse magnetic field is applied to slow the vertical velocity of the electrons which are accelerated radially by the magnetic field as they move towards the wafer. Accordingly, the quantity of electrons in the plasma is increased by means of the transverse magnetic field and the plasma is enhanced as described in Foster et al U.S. Pat. No. 4,668,365 for "Magnetron Enhanced Plasma Etching Process", Wong et al European Patent Application No. EP0 272 143-A for "Bromine and Iodine Etch Process for Silicon and Silicides", and Andrews et al European Patent Application No. EP-0 272 142-A which relates to a magnetically enhanced plasma etch reactor for semiconductor wafers which provides a magnetically controlled magnetic field for etching. Electromagnets which provide the magnetic field are independently controlled to produce a field intensity orientation which is uniform. The field can be stepped angularly around the wafer by rotating the energization of the electromagnets, sequentially. U.S. Pat. No. 4,740,268 of Bukhman describes another "Magnetically Enhanced Plasma System" which rotates a transverse magnetic flux field B over a wafer, parallel to its surface, in an electrically excited plasma chamber. The lines of flux are normal to the electric field E which is directed normal to the wafer of the lower electrode in the Bukhman patent.

2. Magnetic Field Enhancement

The use of a transverse magnetic field directed parallel to the surface being treated by the plasma and the cathode of the plasma reactor increases ionization efficiency of the electrons in the plasma. This provides the ability to decrease the potential drop across the cathode sheath and to increase the ion current flux present on the wafer surface, thereby permitting higher rates of etching without requiring higher ion energies to achieve the result otherwise.

The preferred magnetic source used to achieve magnetically enhanced RIE used in practicing this invention is a variable rotational field provided by two sets of electromagnetic coils arranged in a Helmholtz configuration. The coils are driven by 3-phase AC currents. The magnetic field with flux B is parallel to the wafer substrate, and perpendicular to the electrical field as shown in FIG. 1A. Referring to FIG. 1B, the vector of the magnetic field H which produces flux B is rotating around the center axis of the electrical field by varying the phases of current flowing through coils at a typical rotational frequency of 0.01 to 1 Hz, particularly at 0.5 Hz. The variable strength of the magnetic flux B typically from 0-150 Gauss is determined by the quantities of the currents supplied to the coils.

In the case of etching of silicon nitride with an etchant of gases including bromine and oxygen, the magnetic field flux, typically at 30-60 Gauss provides enhancement to the dissociation of the Br compounds (reaction (1)) and also $O_2$ gas, and thus increases the rate of etching of silicon nitride. On the other hand, the etching-reoxidation equilibrium of reaction (3) is not being affected. Thus, the higher selectivity of silicon nitride to the underlying silicon oxide is obtained.

3. Process Applications and Trends

Figure 2:
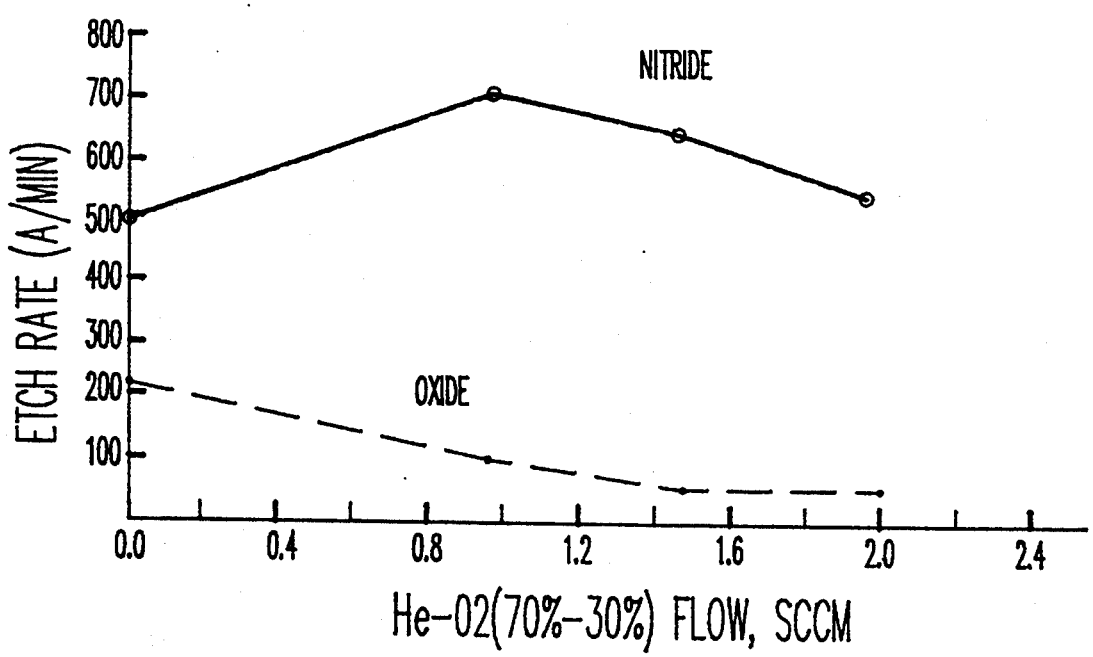
FIG. 2 and FIG. 3 are graphs of etch rates and nitride to oxide selectivity respectively as a function flow rates of helium and oxygen.
Figure 3:
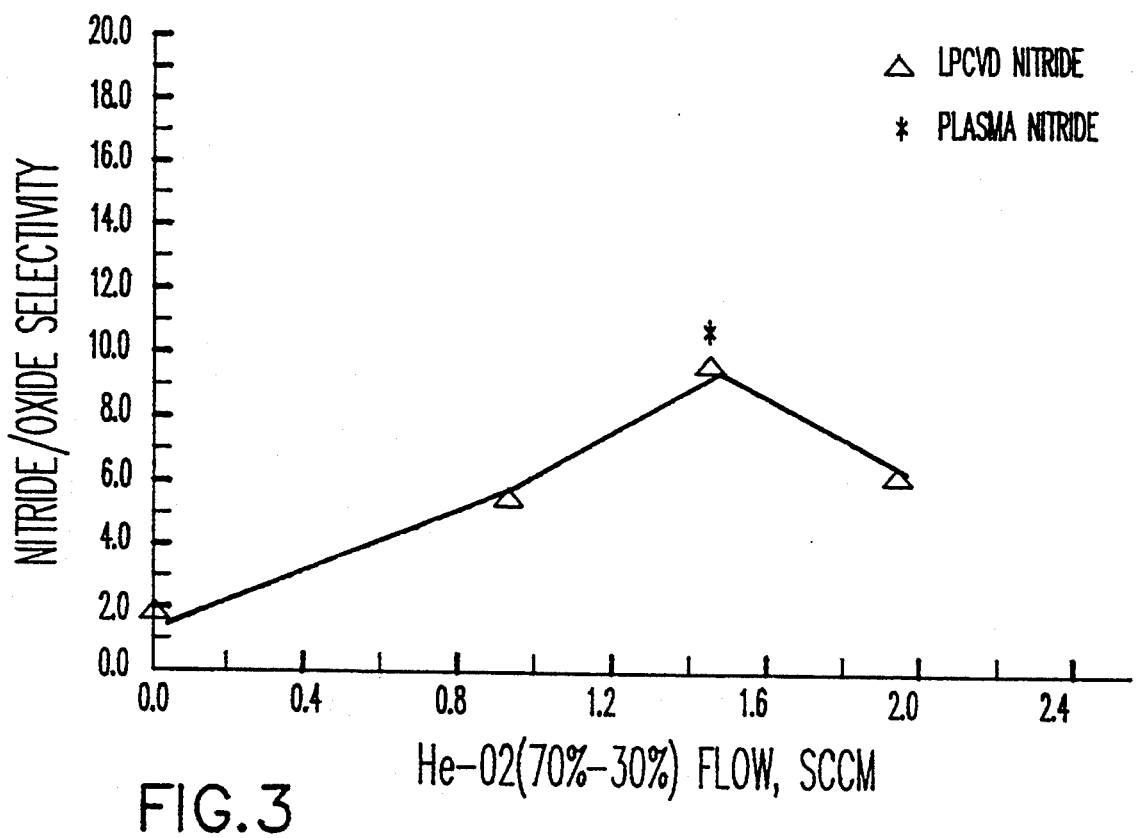

Highly selective etching of silicon nitride over underlying silicon oxide can be achieved by taking advantage of the magnetically enhanced plasma in the reactor system of FIG. 1A using gases containing bromine and oxygen. The flow rates of oxidant etchant such as $O_2$ control the rate of etching and the selectivity of nitride/oxide as shown in FIGS. 2 and 3. At these selected conditions, nitride etching rates are not a strong function of the percent of oxygen in the total gas flow. However, the oxide etching rate is initially decreased as small amounts of-oxygen are included in the gas mixture, and the oxide etching rate levels off as the oxygen flow rate is increased further. The helium in the etchant gases is used as a reaction inert material or as a diluent, which does not affect the etching rate or the selectivity of the etching process. The different process trends for nitride and oxide rates of etching with respect to increasing oxygen composition in the total gas flow allow the selectivity of nitride to oxide to increase an to reach an optimum at around 12.6:1, as indicated in FIG. 3. Referring to reaction equation (3) above, increasing the flow rate of oxygen gas can result in an increase in the rate of re-oxidation of $SiBr_y$ species and can form deposited $SiOx$ т $SiO_2$, which can cause a reduction of the etching rate which can cause a corresponding increase of relative etching selectivity of nitride-to-oxide. However, a further increase of the flow rate of oxygen gas can result in excess $SiO_2$ formation which hampers the rate of etching of the nitride. In general, an optimal rate of etching and an optimal selectivity ratio are both dependent upon an appropriate composition of the $O_2$ etchant in the total gas flowing through the chamber.

Figure 4:
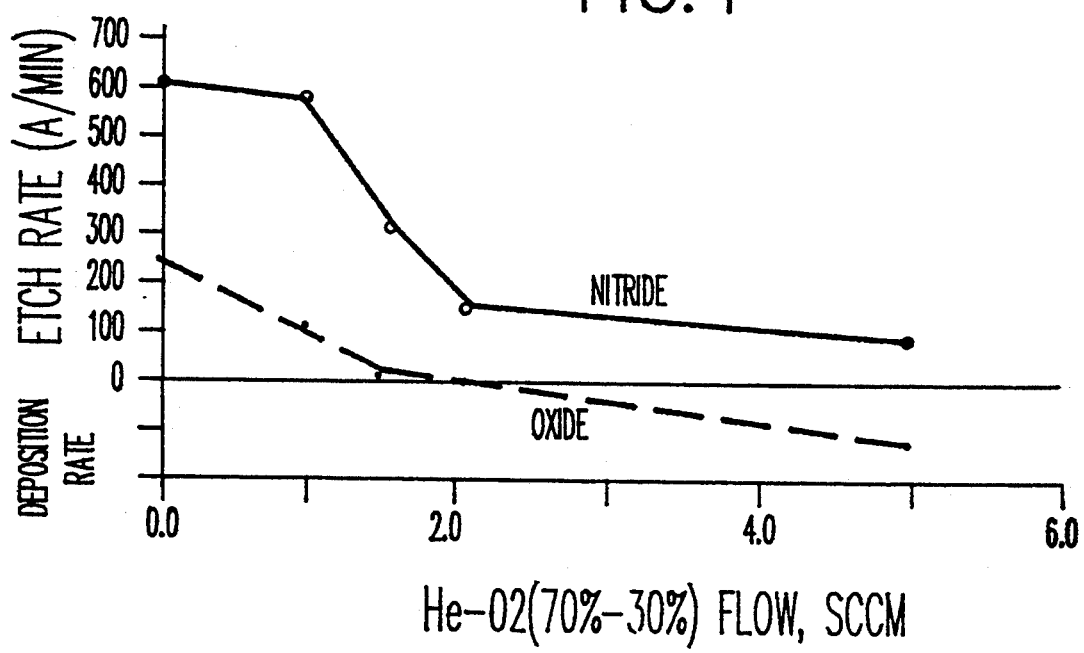
FIG. 4 is a graph of etch rate as a function of flow rates of helium and oxygen with SiF₄ addition.

FIG. 4 indicates the effect of adding a silicon containing gas, particularly $SiF_4$, to the reactive gas. Addition of $SiF_4$ can have an effect on rate of etching for selected process conditions. As indicated by FIG. 4, both the rates of nitride and oxide etching were more significantly influenced by the increase of the oxygen flow rate in the presence of 1.5 sccm (standard cubic cm per minute) of $SiF_4$ in the total gas flow. It is envisioned as the oxygen concentration increases that the rake of $SiO_2$ deposition increases sharply as a result of the following reaction:

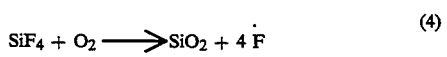

$$SiF_4 + O_2 \longrightarrow SiO_2 + 4F \qquad (4)$$

Figure 5:
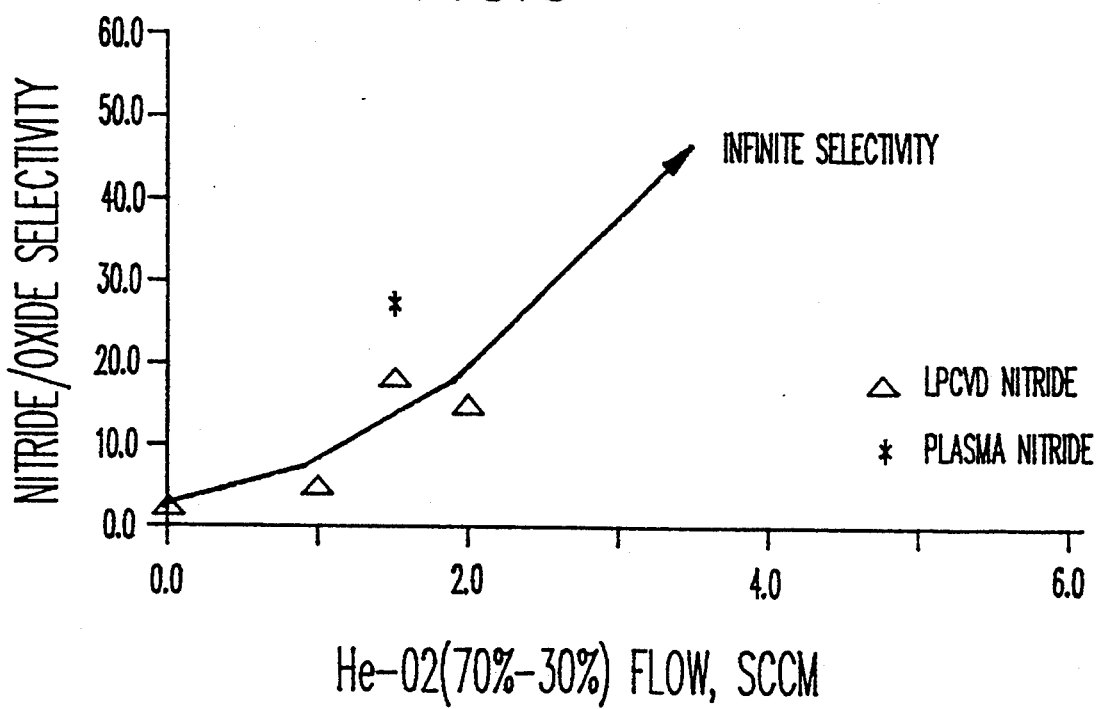
FIG. 5 is a graph of nitride/oxide selectivity as a function of helium oxygen flow rates with SiF₄ addition.

Both nitride and oxide rates of etching have shown a downward trend as the $SiO_2$ deposition increases with the increasing of the oxygen flow rate. The nitride-to-oxide selectivity is calculated from the nitride etching rate divided by the oxide etching rate, which increases sharply with increasing oxygen flow and it reaches infinity at a zero oxide rate as shown in FIG. 5. Further increase in the oxygen flow rate results in a net $SiO_2$ deposition at the nitride/oxide interface.

FIG. 1A AND FIG. 1B shows a chamber housing a plasma etching reactor with an electromagnetic unit for enhancing the plasma.

Method 1

We have discovered when etching away films of silicon nitride with fluoride containing etchants in the presence of oxygen that a film of thin oxide or oxynitride prevents rapid etching of the silicon nitride film. However, the use of oxygen is helpful for the purpose of etching away the silicon nitride once the oxynitride film has been removed from the surface of the silicon nitride layer. Accordingly we have developed a two step process of plasma etching silicon nitride selectively with respect to other films such as silicon oxide or silicon dioxide.

PROCESS I

Breakthrough of the Surface of Oxynitride

The first phase of the process is to break through, i.e. clean and etch away the surface oxynitride which is a thin layer of about 50 Angstroms in thickness on the surface of the layer of silicon nitride. The first phase is performed in the absence of an oxidant such as oxygen, since the purpose of this step is to reduce the oxygen which forms the oxynitride layer. In the case of both Process I and Process II below, a reactive plasma is formed in the reactor including HBr and a gas from the group of fluorine-containing gases consisting essentially of $SF_6$, $CF_4$ and $C2F_6$ and $NF_3$. The gas composition preferably includes

| | |
|---|---|
| (0-90%) | HBr |
| (10-100%) | fluorine-containing gas. |
| (0%) | oxygen or oxidant gas. |
| Preferred reactor conditions | |
| pressure | low |
| Temperature | 25 degrees C. |
| RF power | 200-300 watts |
| rotational magnetic field | 0-45 Gauss. |

Main Etching Step: Plasma Etching of $Si_3N_4$

In the second phase of the process, with the oxynitride removed, the exposed layer of $Si_3N_4$ is etched with a bromine and oxygen containing reactive gas mixture preferably consisting of HBr, an oxidant selected from the group consisting of $O_2$, $CO_2$, or $N_2O$ and a diluent gas such as He, $N_2$ or Ar. It will be noted that in this case the main etching step is performed in the absence of $SiF_4$ or any other fluorine containing gases. The preferred reactor conditions are as follows:

TABLE I

The gas composition broadly includes as follows:

| | |
|---|---|
| 60–95% | HBr |
| 0% | $SiF_4$ |
| 2–15% | an oxidant ($O_2$, $CO_2$, or $N_2O$) |
| 0–45% | diluent gas |
| Preferred reactor conditions | |
| pressure | 50–150 mTorr |
| RF power | 200–400 watts |
| rotational magnetic field | 25–70 Gauss |
| $Si_3N_4$ etch rate | 300–1000 Angstroms/min |

The selectivity of $Si_3N_4/SiO_2$ is better than 6:1 up to 12.6:1 in our experiments.

More generally, the process parameters fall into ranges as follows listed on the basis of flow rates of the gases as listed in TABLE II below.

TABLE II

| Process | Broad | Preferred | Optimum |
|---|---|---|---|
| Gas Flow, sccm | | | |
| HBr | 0–20 (0–91%) | 5–15 (45–83%) | 10 (77%) |
| $SF_6$ | 2–10 (9–100%) | 3–6 (17–55%) | 3 (23%) |
| Pressure, mT | 20–150 | 50–100 | 50 |
| Power Density (W/cm2) | 0.82–3.3 | 1.63–2.4 | 1.65 |
| Time, sec | 4–20 | 6–10 | 8 |
| Magnetic Field Gauss | 0–45 | 0–25 | 0 |
| MAIN ETCH | | | |
| Gas Flow, sccm | | | |
| HBr | 10–30 (71–96%) | 15–25 (80–95%) | 20.00 (93%) |
| $O_2$ | 0.15–2 (2–7%) | 0.3–1 (2–5.7%) | 0.45 (2.1%) |
| He | 0–10 (0–25%) | 0–2 (0–20%) | 1.05 (4.9%) |
| Pressure, mT | 20–150 | 50–120 | 100 |
| Power Density (W/cm2) | 0.82–3.3 | 1.63–2.4 | 1.65 |
| Etch Rate (A/min) | 300–1000 | 500–700 | 600 |
| Magnetic Field Gauss | 0–75 | 25–60 | 45 |
| $Si_3N_4$-to-$SiO_2$ selectivity | | | |
| LPCVD Nitride | >4:1 | >6:1 | 12.6:1 |
| Plasma Nitride | >4:1 | >6:1 | 13.5: |

PROCESS II

Plasma etching the $Si_3N_4$ layer over the $SiO_2$ layer in a magnetically-enhanced etch reactor with the steps as follows.

Breakthrough of the Surface of Oxynitride

This step is the same as in proposed process I.

Main Etching Step: Plasma Etching of $Si_3N_4$

In the second phase of process II, with the oxynitride removed, the now exposed layer $Si_3N_4$ is etched with a bromine, oxygen and fluorine containing reactive gas mixture preferably consisting of HBr, $SiF_4$, an oxidant selected from the group consisting of $O_2$, $CO_2$, or $N_2O$ and a diluent gas selected from the group He, $N_2$ and Ar. The preferred reactor conditions are as follows:

The gas composition broadly can include as follows:

| | |
|---|---|
| 50–83% | HBr |
| 5–15% | $SiF_4$ |
| 2–15% | an oxidant ($O_2$, $CO_2$, or $N_2O$) |
| 0–45% | diluent gas |
| Preferred reactor conditions | |
| pressure | 50–150 mTorr |
| RF power | 200–400 watts |
| rotational magnetic field | 25–70 Gauss |
| $Si_3N_4$ etch rate | 300–800 A/min |

Using the process II etching of nitride occurs with a selectivity of $Si_3N_4/SiO_2$ of better than 6:1 and up to over 100:1. However, a loss of nitride etch rate an an increase in etch non-uniformity are accompanied with the increased selectivity.

The data listed in TABLE IV below illustrates the useful ranges of process parameters for selectively etching the nitride over underlying thermal oxide or plasma oxide. The selectivity for the plasma deposited nitride is slightly higher than that for LPCVD (Low Pressure Chemical Vapor Deposition) nitride. The application of magnetic field enhancement to the plasma is essential for providing high ionization efficiency and adequate etching rate of the nitride layer. Also as shown in Table II, the addition of $SiF_4$ in the HBr/$O_2$/He etchant is the main etching step which enhances the rate of $SiO_2$ deposition and increases nitride to-oxide selectivity.

TABLE IV

| Process | Broad | Preferred | Optimum |
|---|---|---|---|
| Gas Flow, sccm | | | |
| HBr | 0–20 | 5–15 | 10 |
| $SF_6$ | 2–10 | 3–6 | 3 |
| Pressure, mT | 20–150 | 50–100 | 50 |
| Power Density (W/cm2) | 0.82–3.3 | 1.63–2.4 | 1.65 |
| Time, sec | 4–20 | 6–10 | 8 |
| Magnetic Field Gauss | 0–45 | 0–25 | 0 |
| MAIN ETCH | | | |
| Gas Flow, sccm | | | |
| HBr | 10–30 (50–90%) | 10–20 (70–85%) | 15 (83%) |
| $O_2$ | 0.15–2 (2–15%) | 0.3–1 (3–7%) | .45 (2.6%) |
| He | 0–10 (0–30%) | 0–4 (0–20%) | 1.05 (6.0%) |
| $SiF_4$ | 0.5–2.5 (5–15%) | 1–2 (5–9%) | 1.5 (8.4%) |
| Pressure, mT | 20–150 | 50–120 | 100 |
| Power Density (W/cm2) | 0.82–3.3 | 1.63–2.4 | 1.65 |
| Etch Rate (A/min) | 200–700 | 250–450 | 300 |
| Magnetic Field Gauss | 0–75 | 25–60 | 45 |
| $Si_3N_4$-to-$SiO_2$ selectivity LPCVD Nitride | >6:1 | >10:1 | 17:1 |

EXAMPLE

Figure 6:
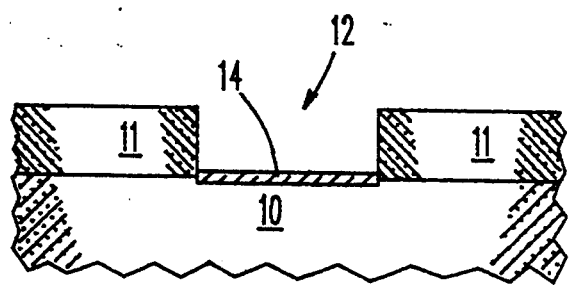
FIG. 6 is a sectional view of a substrate having an opening with a layer of silicon dioxide at the base. The substrate is prepared for processing with silicon nitride.
Figure 7:
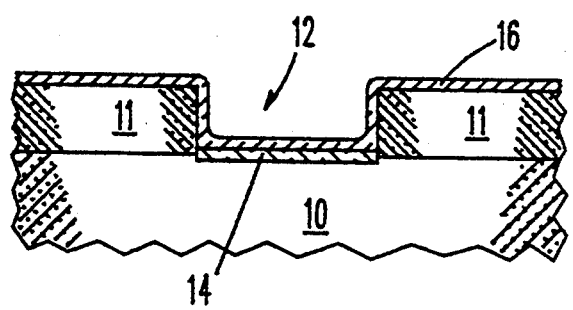
FIG. 7 is a view of the product of FIG. 6 after a layer of silicon nitride has been deposited.

Referring to FIGS. 6–10, the drawings show sectional views of the results of a sequence of steps in an integrated advanced bipolar semiconductor sidewall process. Referring to FIG. 6, a wafer with a silicon substrate 10, is coated with a film 11 of polysilicon which has a contact opening 12 with a lower layer of $SiO_2$ 14 at the bottom of opening 12. The process includes steps as follows:

1) FIG. 7 shows a deposit on the wafer of FIG. 6 of a thin film 16 of $Si_3N_4$ (approx. 200-500 Angstroms thick) over the film 11 and over the layer of $SiO_2$ 14 at the base of opening 12. The opening 12 and sidewall and the polysilicon film 11 are all coated with the silicon nitride film 16.

Figure 8:
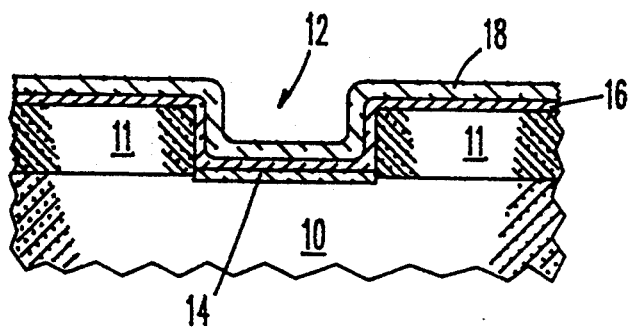
FIG. 8 is a view of the product of FIG. 7 after a layer of silicon dioxide has been deposited on the layer of silicon nitride.

2) Referring to FIG. 8, using a TEOS (TetraEthylOrthoSilicate) liquid, deposit $SiO_2$ (approx. 1000-3000 Angstroms thick) on top of the nitride layer produced in step 1) above. This produces an $SiO_2$ sidewall layer 18 on top of thin film 16.

Figure 9:
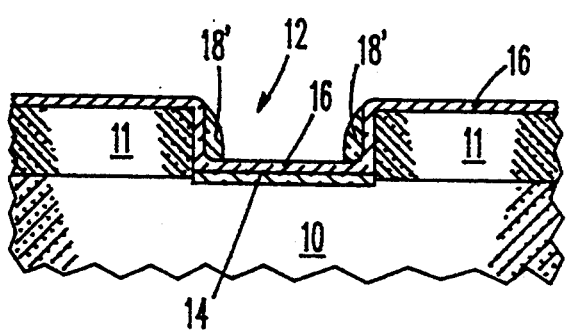
FIG. 9 is a view of the product of FIG. 8 after the top layer of silicon dioxide has been etched away leaving a sidewall structure of silicon dioxide on the sides of the opening in the substrate.

3) Referring to FIG. 9, an etch of the top $SiO_2$ layer 18 has been performed to leave just the sidewalls 18' as the lower layer of $Si_3N_4$ 16 is exposed by the removal of the remainder of layer 18. A $CF_4/Ar$ plasma forms the $SiO_2$ sidewalls 18' at the opening with a 15% overetch. The endpoint is controlled by an optical emission monitoring device.

Figure 10:
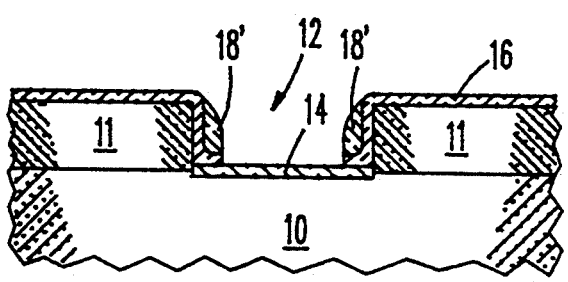
FIG. 10 is a view of the product of FIG. 9 after the silicon nitride exposed has been etched away between the sidewall structures.

4) In FIG. 10 is shown the device of FIG. 9 after etching away of the exposed surface of the underlying $Si_3N_4$ layer 16 in hole 12, exposing the surface of layer 14 of $SiO_2$ from FIG. 6, which is carrying the sidewall pattern 18', as well as, the edges of layer 16. The etchant used is $HBr/SF_6$ and $HBr/O_2/He$ according to the process conditions in Process I above. The process I steps is performed by a time-etch of 60 sec. which includes a 25% overetch. Measurements have indicated a complete removal of nitride over $SiO_2$ and no measurable loss of the $SiO_2$ in the sidewall pattern 18' during that etch.

What is claimed is:

1. A method of etching a silicon nitride layer on a substrate, said substrate coated on its surface with a silicon oxide layer, in turn coated on its surface with a silicon nitride layer, in turn coated on its surface with an oxide or oxynitride containing film, said method comprising performing in a plasma reactor the steps on said substrate, as follows:

(1) a breakthrough step of employing a plasma of oxygen free etchant gases to break through and to remove said oxide or oxynitride containing film from said surface of said silicon nitride layer, and The gas composition includes as follows:

| | |
   |---|---|
   | 0-90% | HBr |
   | 9-100% | $SF_6$. |
   | 0% | oxygen or oxidant gas. |
   | Reactor conditions | |
   | pressure | low |
   | Temperature | 25 degrees C. |
   | RF power | 200-300 watts |
   | rotational magnetic field | 0-45 Gauss |

| Process | Parameters |
   |---|---|
   | Gass Flow, sccm | |
   | HBr | 0 to 20 sccm, 0-91% |
   | $SF_6$ | 2 to 10 sccm, 9-100% |
   | Pressure, mT | 20 to 150 milliTorr |
   | Power Density | 0.82 to 3.3 $W/cm^2$ |
   | Time, sec | 4 to 20 sec. |
   | Magnetic Field | 0 to 45 Gauss |

(2) a main step of etching the newly exposed surface of said silicon nitride layer with etchant gases having high selectivity with respect to said silicon oxide layer underlying said silicon nitride layer employs as follows:

| Process | Parameters |
   |---|---|
   | Gas Flow, sccm | |
   | HBr | 10 to 30 sccm, 71-96% |
   | $O_2$ | 0.15 to 2 sccm, 2-7% |
   | He | 0 to 10 sccm, 0-25% |
   | Pressure, mT | 20 to 150 milliTorr |
   | Power Density | 0.82 to 3.3 $W/cm^2$ |
   | Etch Rate | 300 to 1000 A/min |
   | Magnetic Field | 0 to 75 Gauss |
   | $Si_3N_4$-to-$SiO_2$ selectivity | |
   | LPCVD Nitride | >4:1 |
   | Plasma Nitride | >4:1. |

2. A method of etching a silicon nitride layer on a substrate, in accordance with claim 1 comprising as follows:

(1) Breakthrough step process materials and parameters are employed as follows:

| Process | Parameters |
   |---|---|
   | Gas Flow, sccm | |
   | HBr | 5 to 15 sccm, 45-83% |
   | $SF_6$ | 3 to 6 sccm, 17-55% |
   | Pressure, mT | 50 to 100 milliTorr |
   | Power Density | 1.63 to 2.4 $W/cm^2$ |
   | Time, sec | 6 to 10 sec. |
   | Magnetic Field | 0 to 25 Gauss |

(2) the main step of etching has parameters as follows:

| Process | Parameters |
   |---|---|
   | Gas Flow, sccm | |
   | HBr | 15 to 25 sccm, 80-95% |
   | $O_2$ | 0.3 to 1 sccm, 2-5.7% |
   | He | 0 to 2 sccm, 0-20% |
   | Pressure, mT | 50 to 120 milliTorr |
   | Power Density | 1.63 to 2.4 $W/cm^2$ |
   | Etch Rate | 500 to 700 A/min |
   | Magnetic Field | 25 to 60 Gauss |
   | $Si_3N_4$-to-$SiO_2$ selectivity | |
   | LPCVD Nitride | >6:1 |
   | Plasma Nitride | >6:1 |

3. A method of etching a silicon nitride layer on a substrate, in accordance with claim 2 comprising as follows:

(1) Breakthrough step process materials and parameters are as follows:

| Process | Parameters |
   |---|---|
   | Gas Flow, sccm | |
   | HBr | 10 sccm, 77% |
   | $SF_6$ | 3 sccm, 23% |
   | Pressure, mT | 50 milliTorr |
   | Power Density | 1.65 $W/cm^2$ |
   | Time, sec | 8 sec. |
   | Magnetic Field | 0 Gauss |

(2) the main step of etching has parameters as follows:

| Process | Parameters |
   |---|---|
   | Gas Flow, sccm | |
   | HBr | 20 sccm, 93% |
   | $O_2$ | 0.45 sccm, 2.1% |

-continued

| Process | Parameters |
|---|---|
| He | 1.05 sccm, 4.9% |
| Pressure, mT | 100 milliTorr |
| Power Density | 1.65 W/cm$^2$ |
| Etch Rate | 600 A/min |
| Magnetic Field | 45 Gauss |
| Si$_3$N$_4$-to-SiO$_2$ selectivity | |
| LPCVD Nitride | 12.6:1 |
| Plasma Nitride | 13.5:1 |

4. A method of etching a silicon nitride layer on a substrate, said substrate coated on its surface with a silicon oxide layer, in turn coated on its surface with a silicon nitride layer, in turn coated on its surface with an oxide or oxynitride containing film, said method comprising performing in a plasma reactor the steps, as follows:

(1) a breakthrough step of employing a plasma of oxygen free etchant gases to break through and to remove said oxide or oxynitride containing film from said surface of said silicon nitride layer, under the conditions as follows:

| Process | Parameters |
|---|---|
| Gas Flow, sccm | |
| HBr | 0 to 20 sccm, 0–91% |
| SF$_6$ | 2 to 10 sccm, 9–100% |
| Pressure, mT | 20 to 150 milliTorr |
| Power Density | 0.82 to 3.3 W/cm$^2$ |
| Time, sec | 4 to 20 sec. |
| Magnetic Field | 0 to 45 Gauss |

(2) a main step of etching the newly exposed surface of said silicon nitride layer with etchant gases having high selectivity with respect to said silicon oxide layer underlying said silicon nitride layer employs as follows:

| Process | Parameters |
|---|---|
| Gas Flow, sccm | |
| HBr | 10 to 30 sccm, 50–90% |
| O$_2$ | 0.15 to 2 sccm, 2–15% |
| He | 0 to 10 sccm, 0–30% |
| SiF$_4$ | 0.5 to 2.5 sccm, 5–15% |
| Pressure, mT | 20 to 150 milliTorr |
| Power Density | 0.82 to 3.3 W/cm$^2$ |
| Etch Rate | 200 to 700 A/min |
| Magnetic Field | 0 to 75 Gauss |
| Si$_3$N$_4$-to-SiO$_2$ selectivity | >6:1 |
| LPCVD Nitride | |

5. A method of etching a silicon nitride layer on a substrate, in accordance with claim 4 comprising as follows:

(1) Breakthrough step process materials and parameters are employed as follows:

| Process | Parameters |
|---|---|
| Gas Flow, sccm | |
| HBr | 5 to 15 sccm, 45–83% |
| SF$_6$ | 3 to 6 sccm, 17–55% |
| Pressure, mT | 50 to 100 milliTorr |
| Power Density | 1.63 to 2.4 W/cm$^2$ |
| Time, sec | 6 to 10 sec. |
| Magnetic Field | 0 to 25 Gauss |

(2) the main step of etching has parameters as follows:

| Process | Parameters |
|---|---|
| Gas Flow, sccm | |
| HBr | 11 to 20 sccm, 70–85% |
| O$_2$ | 0.3 to 1 sccm, 3–7% |
| He | 0 to 2 sccm, 0–20% |
| SiF$_4$ | 1 to 2 sccm, 5–9% |
| Pressure, mT | 50 to 120 milliTorr |
| Power Density | 1.63 to 2.4 W/cm$^2$ |
| Etch Rate | 250 to 450 A/min |
| Magnetic Field | 25 to 60 Gauss |
| Si$_3$N$_4$-to-SiO$_2$ selectivity | >10:1 |
| LPCVD Nitride | |

6. A method of etching a silicon nitride layer on a substrate, in accordance with claim 5 comprising as follows:

(1) Breakthrough step process materials and parameters are employed as follows:

| Process | Parameters |
|---|---|
| Gas Flow, sccm | |
| HBr | 10 sccm, 45–83% |
| SF$_6$ | 3 sccm, 17–55% |
| Pressure, mT | 50 milliTorr |
| Power Density | 1.65 W/cm$^2$ |
| Time, sec | 8 sec. |
| Magnetic Field | 0 Gauss |

(2) the main step of etching has parameters as follows:

| Process | Parameters |
|---|---|
| Gas Flow, sccm | |
| HBr | 15 sccm, 83% |
| O$_2$ | 0.45 sccm, 2.6% |
| He | 1.05 sccm, 6.0% |
| SiF$_4$ | 1.5 sccm, 8.4% |
| Pressure, mT | 100 milliTorr |
| Power Density | 1.65 W/cm$^2$ |
| Etch Rate | 300 A/min |
| Magnetic Field | 45 Gauss |
| Si$_3$N$_4$-to-SiO$_2$ selectivity | >17:1 |
| LPCVD Nitride | |

7. A method of etching a silicon nitride layer on a substrate, said substrate coated on its surface with a silicon oxide layer, in turn coated on its surface with a silicon nitride layer, in turn coated on its surface with an oxide or oxynitride containing film, said method comprising performing in a plasma reactor the steps on said substrate, as follows:

(1) a breakthrough step of employing a plasma of oxygen free etchant gases to break through and to remove said oxide or oxynitride containing film from said surface of said silicon nitride layer, and The gas composition includes

| | |
|---|---|
| 0–91% | HBr |
| 10–100% | fluorine-containing gas. |
| 0% | oxygen or oxidant gas. |
| reactor conditions | |
| pressure | low |
| Temperature | 25 degrees C. |
| RF power | 200–300 watts |
| rotational magnetic field | 0–45 Gauss |
| Process | Parameters |

| Gas Flow, sccm | |
| --- | --- |
| HBr | 0 to 20 sccm, 0–91% |
| SF$_6$ | 2 to 10 sccm, 9–100% |
| Pressure, mT | 20 to 150 milliTorr |
| Power Density | 0.82 to 3.3 W/cm$^2$ |
| Time, sec | 4 to 20 sec. |
| Magnetic Field | 0 to 45 Gauss |

(2) a main step of etching the newly exposed surface of said silicon nitride layer with etchant gases having high selectivity with respect to said silicon oxide layer underlying said silicon nitride layer employs as follows:

| Process | Parameters |
| --- | --- |
| Gas Flow, sccm | |
| HBr | 10 to 30 sccm, 71–96% |
| O$_2$ | 0.15 to 2 sccm, 2–7% |
| He | 0 to 10 sccm, 0–25% |
| Pressure, mT | 20 to 150 milliTorr |
| Power Density | 0.82 to 3.3 W/cm$^2$ |
| Etch Rate | 300 to 1000 A/min |
| Magnetic Field | 0 to 75 Gauss |
| Si$_3$N$_4$-to-SiO$_2$ selectivity | |
| LPCVD Nitride | >4:1 |
| Plasma Nitride | >4:1 |

* * * * *

UNITED STATES PATENT AND TRADEMARK OFFICE
CERTIFICATE OF CORRECTION

PATENT NO. : 5,431,772
DATED : July 11, 1995
INVENTOR(S) : Wayne T. Babie, Kenneth L. Devries, Bang C. Nguyen, Chau-Hwa J. Yang It is certified that error appears in the above-indentified patent and that said Letters Patent is hereby corrected as shown below:

In Column 6, line 11, after "increases that the" please delete "rake" and insert -- rate --.

In Column 7, line 53, in TABLE II after " > 6:1" please delete "13:5:" and insert -- 13.5:1 --.

Signed and Sealed this

Ninth Day of January, 1996

Attest:

BRUCE LEHMAN

Attesting Officer

Commissioner of Patents and Trademarks